United States Patent [19]
Holcomb et al.

[11] Patent Number: 5,024,129
[45] Date of Patent: Jun. 18, 1991

[54] RADIAL LEAD COMPONENT FEEDER HAVING A NARROW FOOTPRINT

[75] Inventors: Gregory W. Holcomb, 6336 Bryce Ave., Orange, Calif. 92667; Scott A. Hogan; Samuel R. Holcomb, both of Orange, Calif.

[73] Assignee: Gregory W. Holcomb, Orange, Calif.

[21] Appl. No.: 374,159

[22] Filed: Jun. 29, 1989

[51] Int. Cl.$^5$ ............................................. B26D 7/18
[52] U.S. Cl. ................................. 83/107; 83/241; 83/278; 83/282; 83/382; 83/649
[58] Field of Search ................. 29/564.8; 83/241, 162, 83/211, 282, 423, 649, 650, 107, 151, 156, 161, 207, 267, 278, 382, 388, 423, 649, 282

[56] References Cited

U.S. PATENT DOCUMENTS

| | | | |
|---|---|---|---|
| 3,701,298 | 10/1972 | Heller et al. | 83/423 X |
| 4,015,322 | 4/1977 | Cabaud | 29/564.8 X |
| 4,205,473 | 6/1980 | Araki et al. | 29/564.8 X |
| 4,245,385 | 1/1981 | Zemek et al. | 29/564.8 |
| 4,757,600 | 7/1988 | Holcomb | 29/564.8 X |
| 4,780,950 | 11/1988 | Holcomb | 29/564.8 X |

Primary Examiner—Frank T. Yost
Assistant Examiner—Rinaldi Rada
Attorney, Agent, or Firm—Roberts and Quiogue

[57] ABSTRACT

A component lead cutting apparatus for tape-fed radial lead electrical components is disclosed. The taped components are driven through the machine by a rotary index wheel, with the cutting station element adjacent the wheel periphery. Clamping and cutting die elements are placed at the cutting station, and are actuated by a pneumatic cylinder to clamp and cut the lead components. The apparatus includes adjustment elements readily accessible from the top of the machine to raise or lower the index wheel and thereby adjust for different lead cut lengths, and to position the wheel to accommodate different tape sprocket opening configurations. The machine has a compact, narrow footprint, so that the machine is space-efficient.

22 Claims, 11 Drawing Sheets

RADIAL LEAD COMPONENT FEEDER HAVING A NARROW FOOTPRINT

BACKGROUND OF THE INVENTION

The disclosed invention generally relates to apparatus for forming the leads of taped electrical components, and is more particularly directed to apparatus for cutting the leads of taped components having radial leads.

For utilization in the fabrication of electrical circuits, electronic components such as transistors, capacitors, and resistors are provided by component manufacturers with their leads secured to an elongated tape which includes generally equally spaced feed holes. A particular type of component configuration, generally known as radial lead components, have leads which emerge from generally the same side or portion of the component.

For utilization, taped electronic components are separated from the tape by cutting the leads; for some component types, the cut leads are appropriately formed for insertion. The cutting and forming has generally been performed with different types of machinery. For example, dedicated machines cut and form leads, and also insert the components. However, such dedicated machinery generally are capable of processing only a specific component, require a large amount of space, and not readily utilized with robotic component insertion.

Another example of taped component lead cutting machinery are machines which deposit or place the processed components in a container for manual retrieval and insertion. Such machinery are also not readily utilized with robotic component insertion, and may require a large amount of space.

A further example of taped component lead cutting machinery are machines originally designed for manual component retrieval and insertion, and which are modified for use with robotic component insertion. Such machinery, however, tend to be compromises since they are being forced to operate in a manner not contemplated by their original designs.

A radial lead electrical component feeder is disclosed in U.S. Pat. No. 4,757,600, issued to Gregory W. Holcomb, one of the applicants herein. The apparatus disclosed therein cuts and forms the leads. A commercial embodiment of a feeder mechanism embodying the invention of U.S. Pat. No. 4,757,600 has been marketed by Chad Industries,, Orange, Calif., as its model "RC" and "RCO" feeders. This feeder mechanism is adjustable to different component phasing on the tape by adjusting the stop position of the piston rod 153 of air cylinder 151. Adjustments for lead lengths are made by changing shim heights supporting the tape ratchet. While the apparatus disclosed in this patent works well and has many desirable features, it is relatively expensive to manufacture.

SUMMARY OF THE INVENTION

It would therefore be an advantage to provide a reliable apparatus for cutting the leads of taped radial lead electronic components for use with robotic component insertion, which is readily and easily adjusted to cut the leads to a desired length, and to adjust to different tape configurations, and which is relatively inexpensive to manufacture and has a relatively narrow footprint.

A component feeder apparatus is disclosed for clamping and cutting to a predetermined length the leads of electrical components secured to tape. The apparatus includes a rotary tape drive means for driving the tape to sequentially position components at a lead clamping and cutting station. The rotary drive means includes a drive wheel having means for engaging the tape about the wheel periphery and mounted for rotation about a wheel axis. The clamping and cutting station is disposed at the periphery of the wheel and on the longitudinal center line of the apparatus, with the wheel axis extending at a direction normal to the center line. The lead clamping station comprises means for clamping at least one lead of the component positioned at the station and means for cutting to a predetermined length the component leads. The apparatus further comprises means for guiding the tape to the rotary tape drive means and means for guiding the spent tape away from the drive means after the leads of respective successive components have been clamped and cut. After the lead are cut at the station, the component is ready for robotic pick-up.

The apparatus has a narrow footprint and is therefore space efficient. Means are provided for readily adjusting the apparatus to different lead cut lengths and to different tape configurations. The lead length adjusting means comprises a hub lock element actuated by a threaded member extending parallel to but offset from the wheel axis, and accessible readily from the top surface of the apparatus.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION

In the following detailed description and in the several figures, like elements are identified with like reference numerals.

Figure 1:
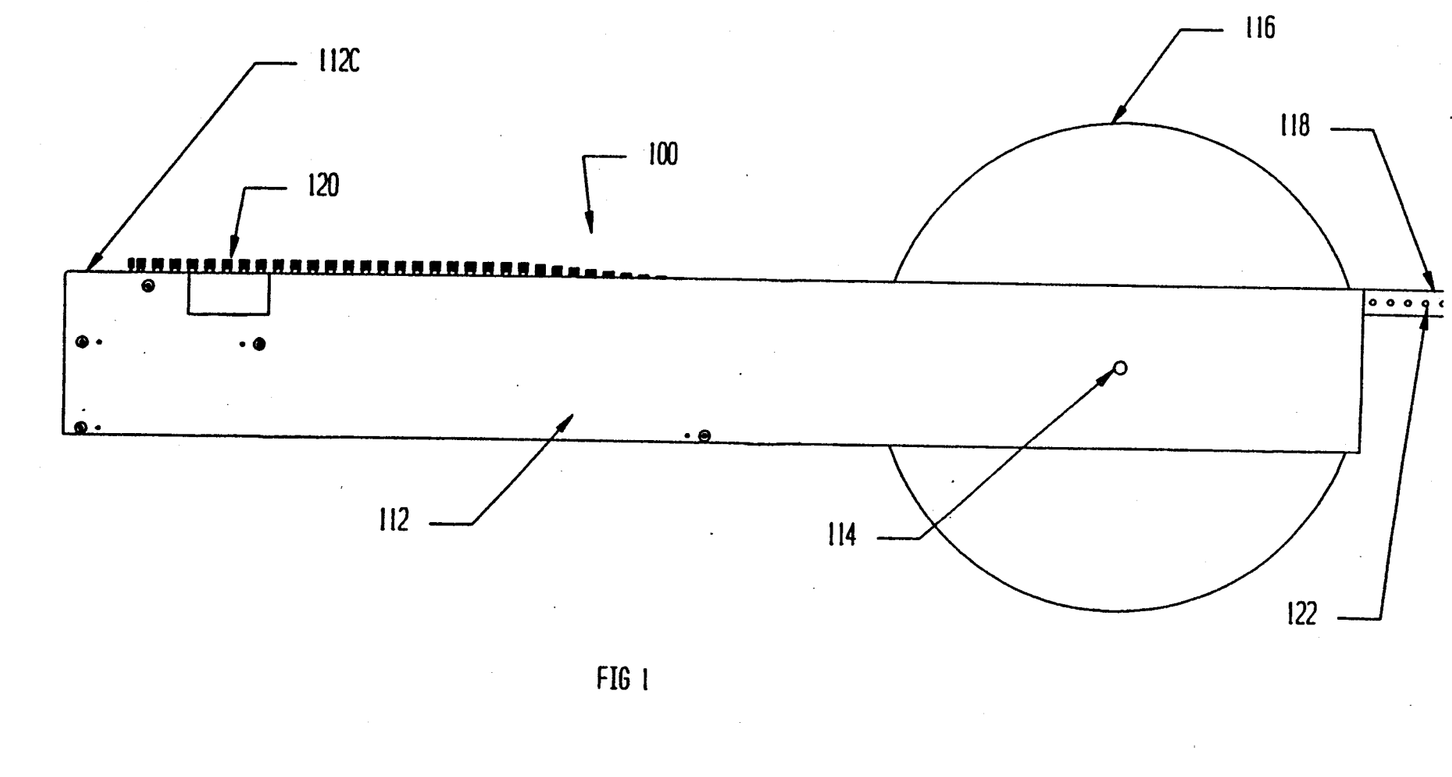
FIG. 1 is a side view of a taped component processing machine which utilizes the taped component lead cutting apparatus of the invention.

Referring now to FIG. 1, shown therein is a side view of a taped component processing machine 100, which includes a base structure 112, generally of a rectilinear configuration and comprising base, side, top and end cover plates. The base plate 112A and the end plate 112B are shown in more detail in FIG. 4. The base structure 112 is adapted to support tape reel shaft 114 through corresponding bores in the side plates of structure 112. The shaft 114 supports an electrical component tape reel 116 of a well-known configuration.

The tape reel 116 stores a tape 118 which secures a plurality of electrical components 120, each having a plurality of leads emerging from generally the same side of the component. As is well known, such lead configuration is known as a radial lead configuration. The leads of the components 120 are secured to the tape 118, which includes a plurality of equally spaced apertures 122 which are useful in feeding the tape through the machine. The particular embodiment shown herein is adapted for lead-in-line components, although the machine can readily be adapted to offset parts by changing the cut clamp die elements. The spent tape travels through the machine and exits behind the tape reel 116, as shown in FIG. 1.

Figure 2:
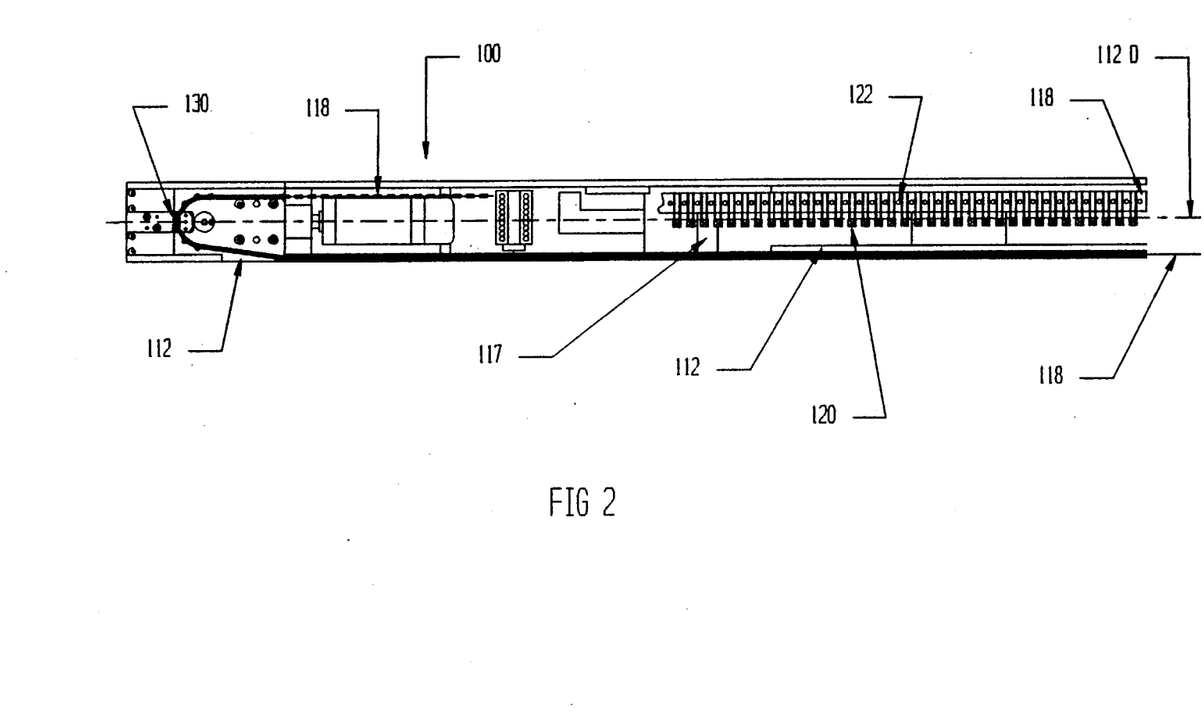
FIG. 2 is a top view of the apparatus of FIG. 1.

The narrow footprint of the machine 100 is apparent in the top view of FIG. 2. The narrow footprint, which may be on the order of three inches, is a significant advantage of the machine 100 since it allows the machine to be closely spaced in a work cell alongside other feeder machines, using only a relatively small amount of space. In a component assembly work cell there may be many feeders which must be spaced so as to be accessible to the component insertion robotic equipment. Therefore, the closer the feeder devices can be spaced relative to adjacent feeders, the more feeders can be arranged around the work cell and the more flexible the insertion system.

The tape 118 is guided over a guide bar 117 and is reeved around an indexer wheel 150 (FIG. 4), undergoing a 90° twist, the tape being rotated from a substantially horizontal orientation at the tape reel to a substantially vertical orientation at the wheel 150. The tape 118 is driven by the indexer wheel 150 to sequentially position successive ones of the electrical components 120 secured on the tape 118 at a lead cutting station generally indicated as station 130 in FIG. 2. In order to minimize the width of the machine footprint, the station 130 is preferably located on the longitudinal center axis 112D of the machine. At this station 130, the leads are clamped and cut to a predetermined length, and the component is then ready for removal, either manually or preferably by automated equipment. In a preferred application, the component is picked up by robotic equipment and inserted in a circuit board.

The spent tape is guided through a slot 113C formed between inner and outer plate members 113A and 113B to exit the machine from the rear thereof. This simplifies the collection of scrap paper resulting from operation, since the tape layers on the reel 116 are usually separated by a paper strip which falls away at the rear of the machine for collection. Both the spent tape and separating paper strip can be collected conveniently in a single receptacle disposed under the rear of the machine.

Figure 3:
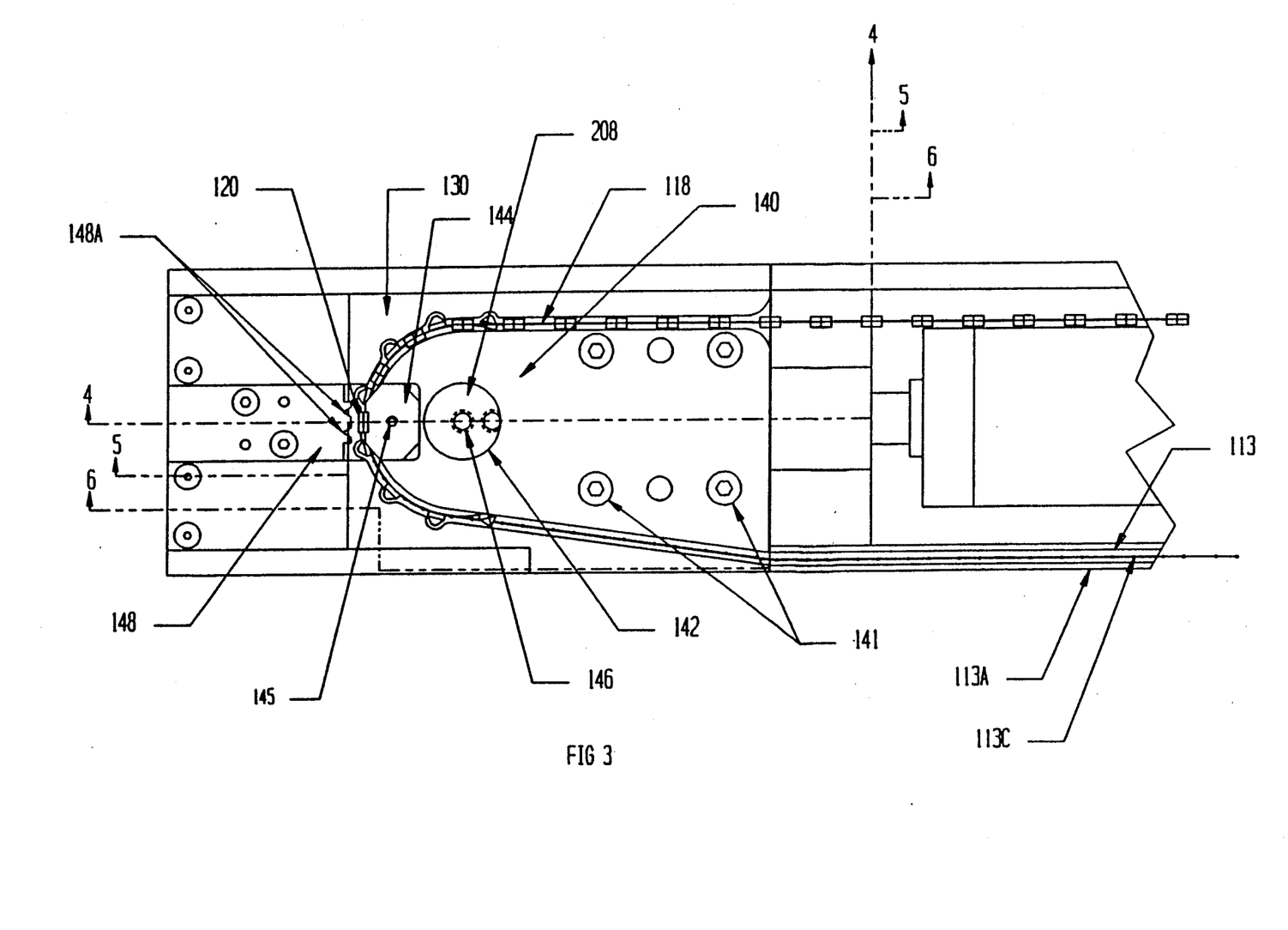
FIG. 3 is an enlarge partial top view of the apparatus of FIG. 1.

FIG. 3 is a partial enlarged top view of the machine 100 showing the cutting station 130 in more detail. The clamping and cutting dies comprise a fixed clamp and cutter element 144, a movable comb-clamp element 148, and a movable cutter element 160. The comb-clamp element 148 is adapted for an in-line component having two in-line leads. Thus, the comb-clamp element 148 has two V-shaped indentations 148A which capture and clamp the component leads.

The fixed cutter blade element 144 is secured to a cover plate 140 by threaded fastener 145. The indexer drive wheel 150 rotates about axis 146 beneath the plate 140, and drives the tape 118 so that successive ones of the components 120 are positioned at the station 130 adjacent the fixed cutter 144. As will be described in further detail, the moving comb 148 and cutter element 160 are actuated to slide in juxtaposition with the fixed cutter 144, thereby effecting the lead clamping and cutting.

Figure 4:
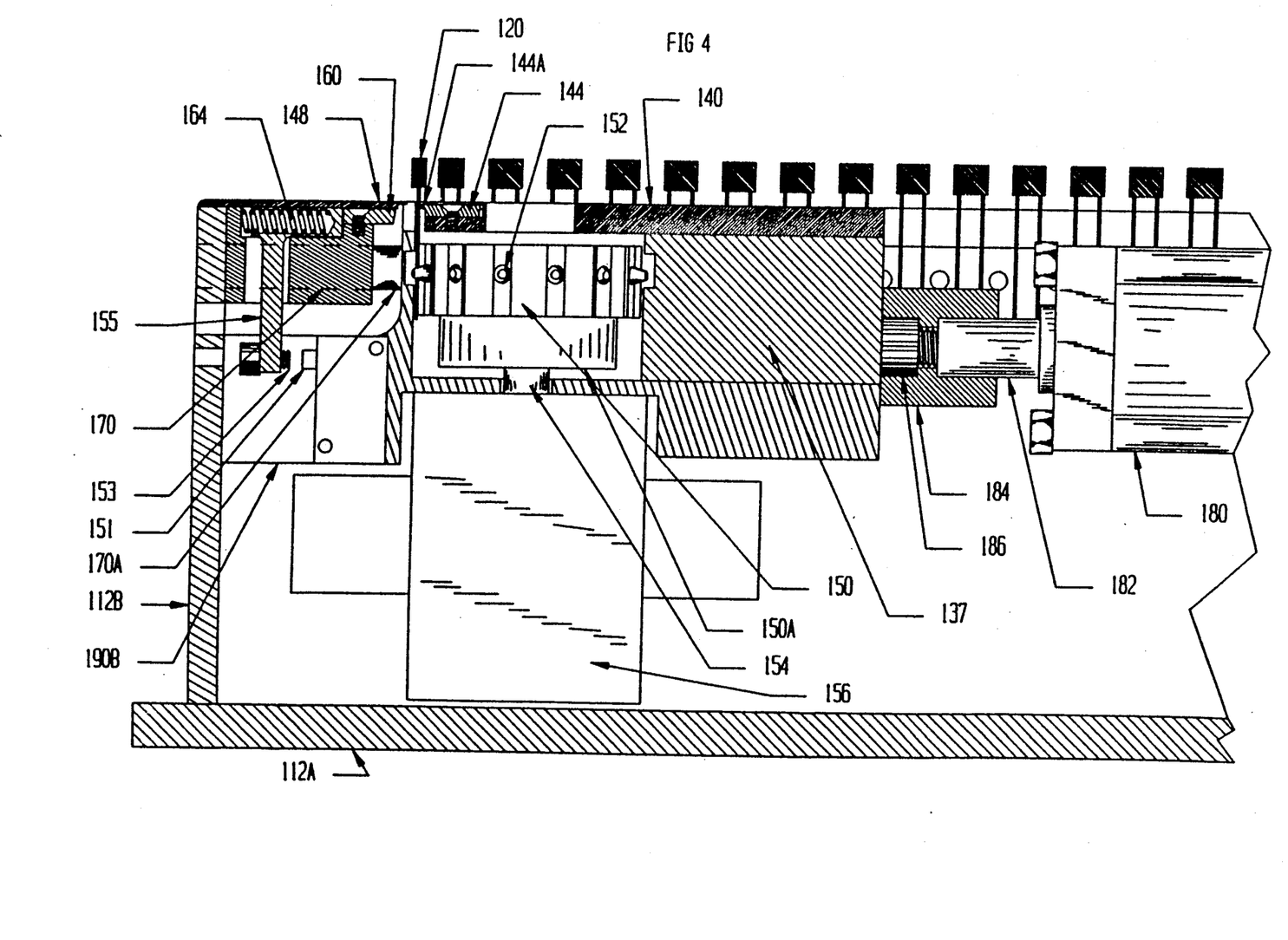
FIG. 4 is a side cross-sectional view taken along line 4—4 of FIG. 3.

FIG. 4 is a cross-sectional view taken along line 4—4 of FIG. 3, and illustrates the cutting station elements and the indexer wheel 150. The indexer wheel 150 includes a plurality of radially extending sprocket pins 152 extending outwardly from the periphery of the wheel and spaced to engage in holes 122 spaced in the tape 118, so that the pins 152 are accepted in the holes 118. The wheel 150 is mounted on a drive shaft 154, which is in turn driven by the pneumatic indexer assembly 156. The assembly 156 is a commercially available device. For example, the indexer model 60289X1, marketed by Rotomation, Inc., Daytona, Fla., can be used as the assembly 156.

The fixed cutter 144 is provided with a cantilevered lip section 144A. The comb-clamp element 148 is mounted on a comb-clamp carriage 157, in turn mounted on a cut element carriage 170, and is actuated to move against the lip section 144A of the fixed cutter 144, in a compound motion with the moving cutter 160 as the cutter 160 and comb 148 are moved from left to right. The comb-clamp element 148 stops against the lip 144A compressing spring 164, which provides a clamping force on the leads of the component 120. The moving cutter 160 is arranged to slide under the lip 144A, shearing the leads of the component 120 by the combined action of the lip 144A and the cutter 160. This is shown more clearly in FIG. 11.

The top plate 140 is secured to support block fixture 137 by threaded fasteners 141. The fixed cutter blade is in turned secured to the top plate 140 by threaded fasteners 141.

The moving cutter element 160 is mounted on the cut carriage 170. The carriage 170 in turn is coupled to a double-acting pnuematic cylinder 180 via the cylinder piston 182 and a tie bar 184 and link assembly. The carriage 170 is mounted for sliding movement on a pair of parallel ways or shafts 170A and 170B. The pneumatic cylinder 180 is double acting, and can be actively driven in either axial direction. Thus, by actuating the pneumatic cylinder 180, the carriage 170 can be moved to pull the carriage 170 to bring the cutter element 160 and the comb-clamp element 148 through a clamp and cut stroke movement to clamp and cut the leads of a component 120, and thereafter to retract the carriage 170 to release the component and allow a fresh component to be brought into position at the station 130. The carriage 170 elements and the links 190A and 190B are arranged to slide along axes which are substantially parallel to the machine center axis 112D. The cylinder 180 extends substantially along the center axis 112D, and is secured to the feeder structure. The arrangement of the carriage elements, the links and cylinder contribute to the narrowness of the machine's footprint.

The piston 182 is fastened to the tie bar 184 by a screw fastener 186. The tie bar 184 connects between two links 190A and 190B which extend along opposite sides of the wheel 150 and connect between the tie bar 184 and the cut carriage 170, transferring the translating forces between the piston-tie bar arrangement and the cut carriage 170.

The machine 100 further comprises a "component present" sensor which provides a signal in the event the comb-clamp element 148 is fully extended and is not stopped by component leads at the lead cutting station 130. The sensor includes a Hall-effect switch 151, actuated by element 153 carried by the comb carriage (FIG. 4).

Figure 5:
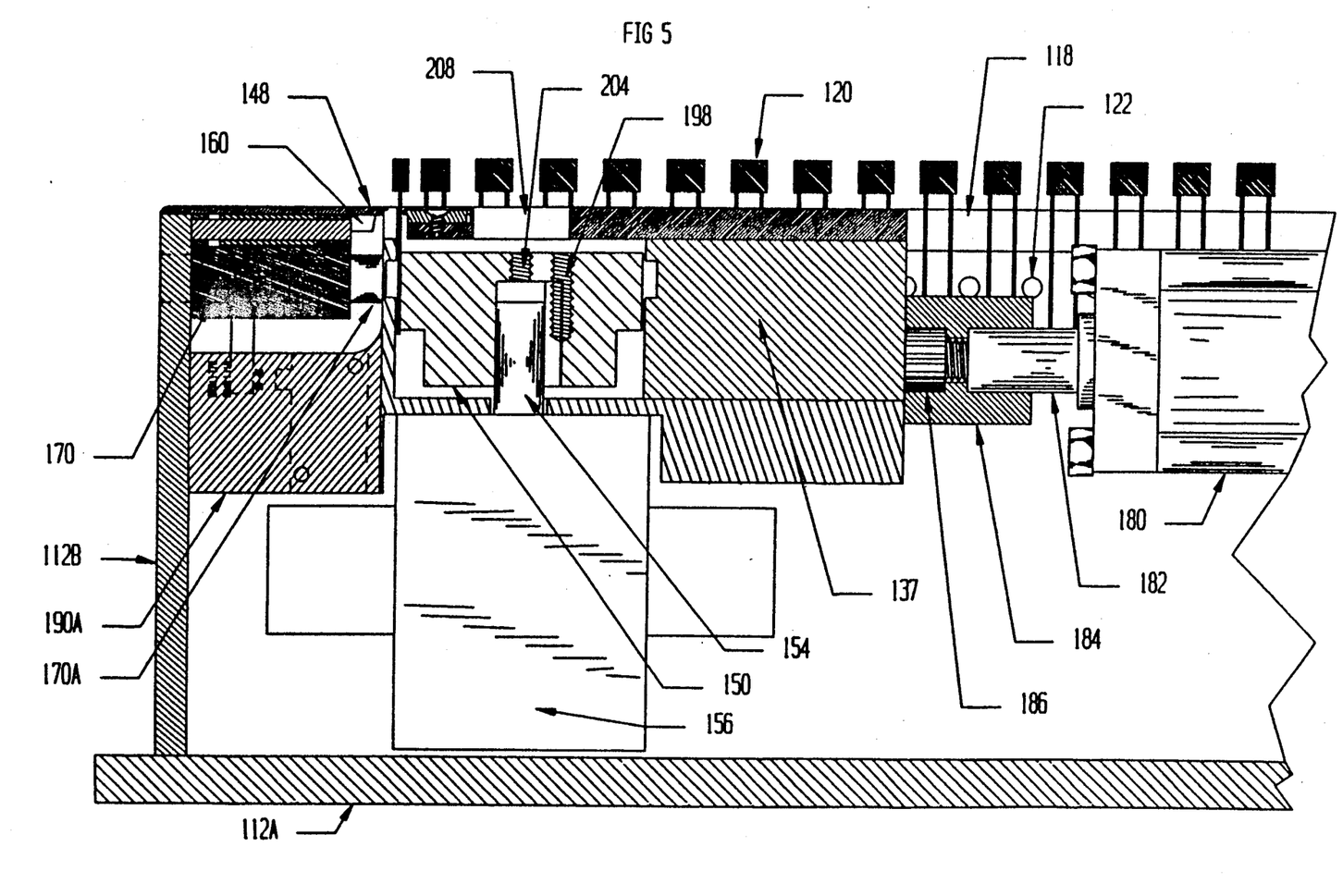
FIG. 5 is a side cross-sectional view taken along line 5—5 of FIG. 3.
Figure 6:
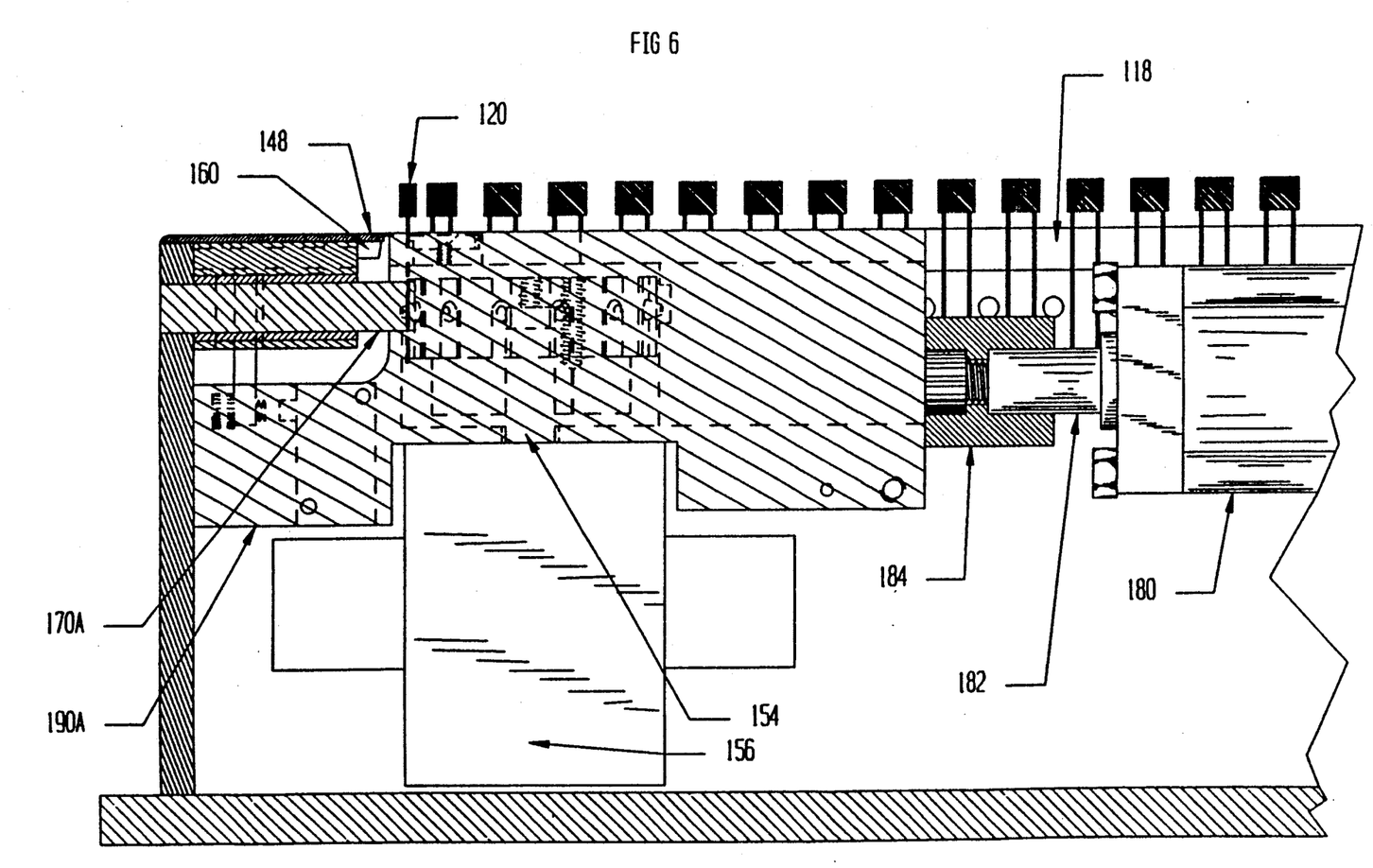
FIG. 6 is a side cross-sectional view taken along line 6—6 of FIG. 3.
Figure 7:
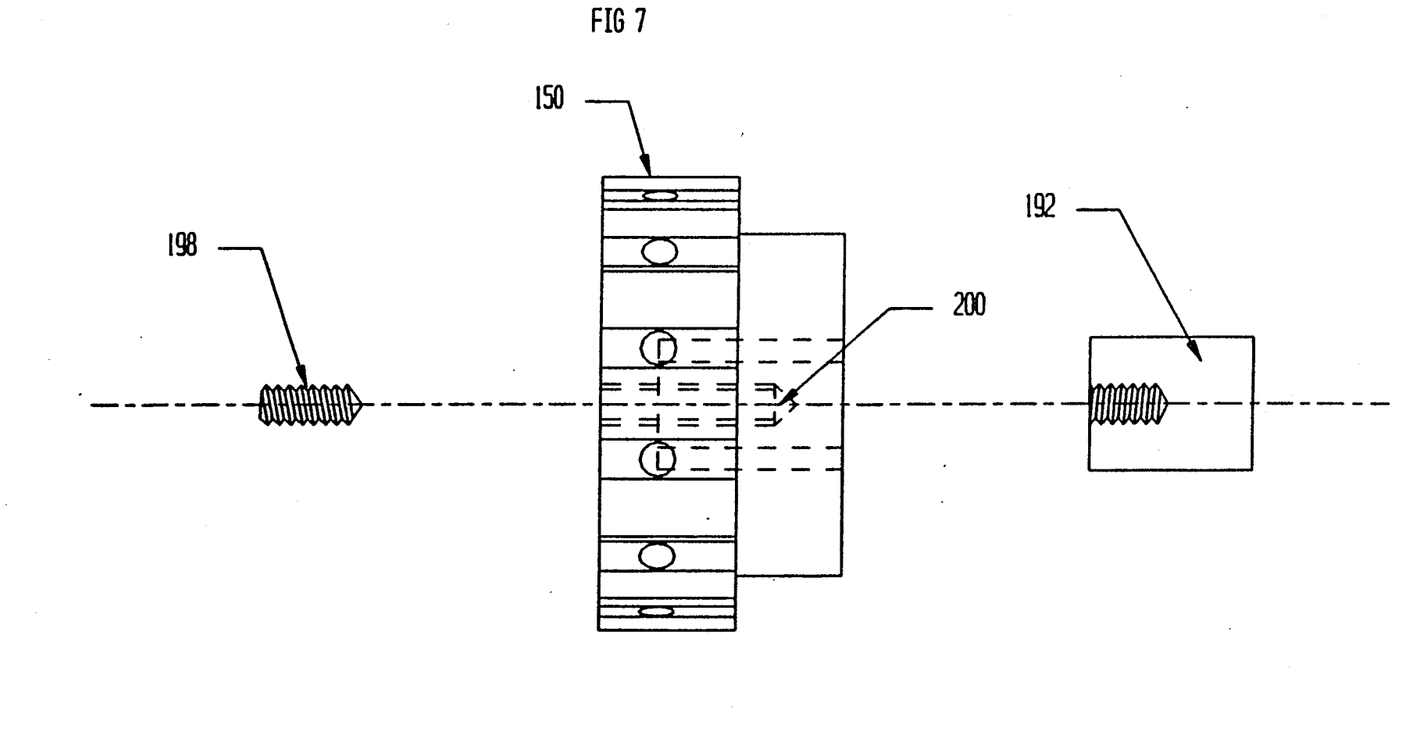
FIG. 7 is an exploded view illustrating the indexer wheel and hub lock elements employed in the apparatus of FIG. 1.
Figure 8:
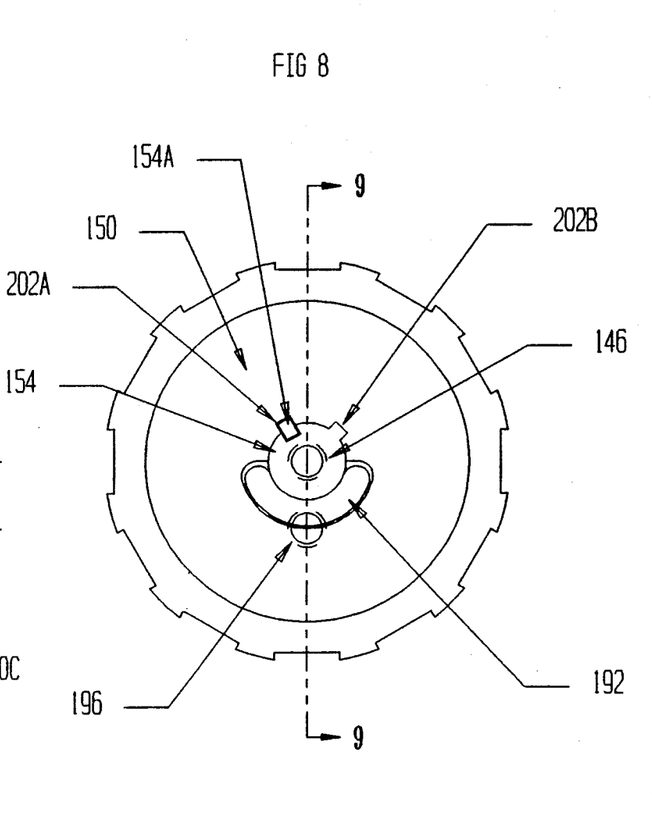
FIG. 8 is a top view of the indexer wheel.
Figure 9:
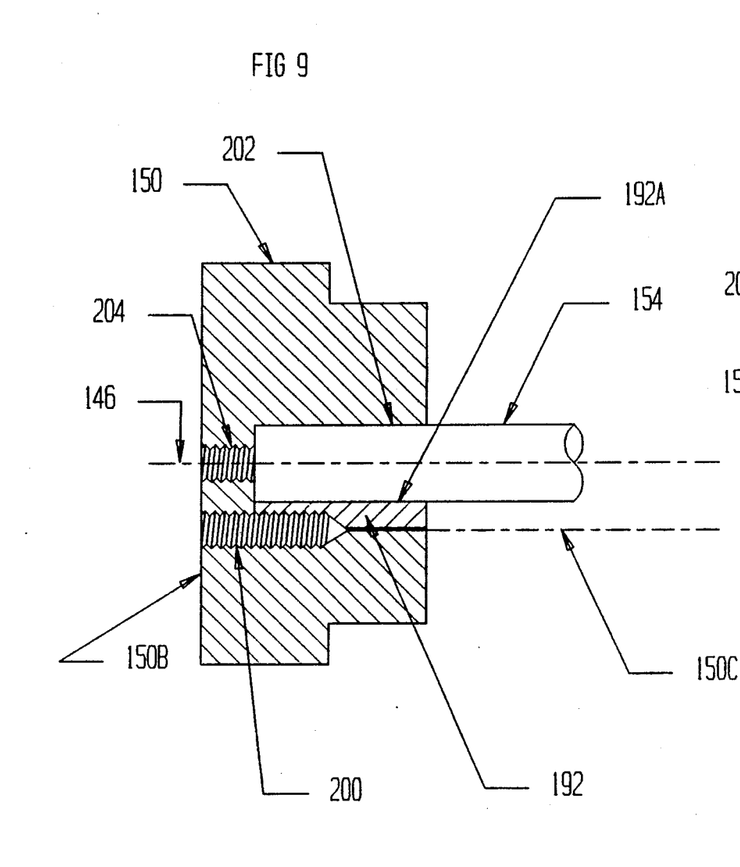
FIG. 9 is a cross-sectional view of the indexer wheel taken along line 9—9 of FIG. 8.

The indexer wheel 150 is removably secured on the shaft 154 by a half-moon hub lock arrangement, shown in FIG. 5 and in more detail in FIGS. 7-9. A shaft bore 202 is formed on the center axis 146 of the wheel 150 and to a predetermined depth into the surface 150A of the wheel 150 to receive the shaft 154. A crescent-shaped hub lock cutout is formed through the surface 150A of the wheel 150 offset from the center, axis 146 thereof. The cutout extends into the wheel 150 to a depth equal to the depth of the shaft bore 202. A hub lock element 192 having a cross-sectional configuration generally matching the cross-sectional configuration of the cutout is fitted into the cutout opening. The interior concave surface 192A of the hub lock element is curved to substantially match the shaft 154 curvature.

A threaded bore 196 is formed through surface 150B of the indexer wheel, offset from the center axis 146, and extends into the wheel and into the combined structure of the lock element 192 and the wheel 150, centered on the parting line 150C between the element 192 and the wheel 150, as shown in FIGS. 7-9. The threaded bore 196 is formed to a predetermined depth and terminates in a taper, typically at about eight degrees, i.e., runout of the tap in the bottom of the threaded bore 196 is about eight degrees. The purpose of the taper is to provide the hub locking action when a threaded bolt 198 is screwed into the bore 196. As the bolt 198 reaches and advances into the taper 200 portion of the bore, the bolt end bears against the taper surface of the two bore-defining portions of the hub lock 192 and wheel 150, tending to force the hub lock 192 toward the shaft bore 202, thereby clamping the hub locking element 192 and the circumferential area of the wheel adjacent the shaft 154 tightly against the shaft 154.

The depth of insertion of the shaft 154 into the shaft bore 202 is controlled by a second threaded bolt 204 threaded, into a threaded bore formed on center with the axis 146 of the wheel 150, extending through the surface 150B and through the wheel 150 into the shaft opening 202. The bolt end 204, when extending into the opening 202, forms a stop surface for limiting the travel of the shaft 154 into the opening 202. This allows quick and convenient adjustment accessible from the top surface 112C of the machine 100 of the cut length of the components leads, since the tape 118 is engaged by the sprocket pins 152 and will be carried upwardly or downwardly with the axial position of the wheel 150 on its drive shaft 154.

A further feature permitting adjustment of the wheel 150 to a tape sprocket hole phasing, wherein a particular sprocket pin is aligned with a corresponding tape sprocket hole, is that two key slots 202A and 202B (FIG. 8) are formed in the wheel 150 adjacent the bore 202 to be engaged by a key 154A fitted into shaft 154 for aligning the wheel 150 to the shaft 154. This permits the machine 100 to be easily adapted to the particular configuration of the sprocket holes 122 in the tape 118.

Some tapes are loaded with components so that the holes 122 are located between the components, while other tapes are loaded so that the leads of a component straddle a hole. The key slots 202A, 202B are offset about the periphery of bore 202 by ½ pitch, i.e., one-half the angular spacing between holes in the tape, so that the key slot 202A positions the tape for one possible tape configuration, and the other slot 202B positions the tape for the other possible tape configuration. In a preferred embodiment, this spacing between slots 202A and 202B is 15°; i.e., the phase difference between the location of the sprocket holes of the two tape configurations.

A major advantage of the means provided to adjust the machine to different lead cut lengths and for different tape configurations is that the adjustment means is made readily available from the top surface 112C of the machine 100. An access opening 208 is formed in the top plate 140, allowing tool access to both adjusting screws 198 and 204. The lead cut length may be adjusted by loosening the bolt 198, and by advancing or retracting the bolt 204 to raise or lower the wheel in relation to the shaft end. The screw 198 is then retightened to clamp the wheel on the shaft 154. The wheel 150 may be readily removed as well, either for maintenance or to move to a different key slot to adjust to a different tape configuration. To accomplish the removal, the top plate fasteners 141 and top plate 140 are removed, and the hub locking screw 198 loosened. The wheel 150 is then simply withdrawn from the shaft 154, and may be repositioned on either key slot, depending on the tape configuration. Thus, the machine 100 may be adjusted quickly and without the time and expense required to remove the machine to carry out such adjustments. As a result machine down time due to adjustment to differing component lead lengths or tape configurations is held to a minimum.

Figure 10:
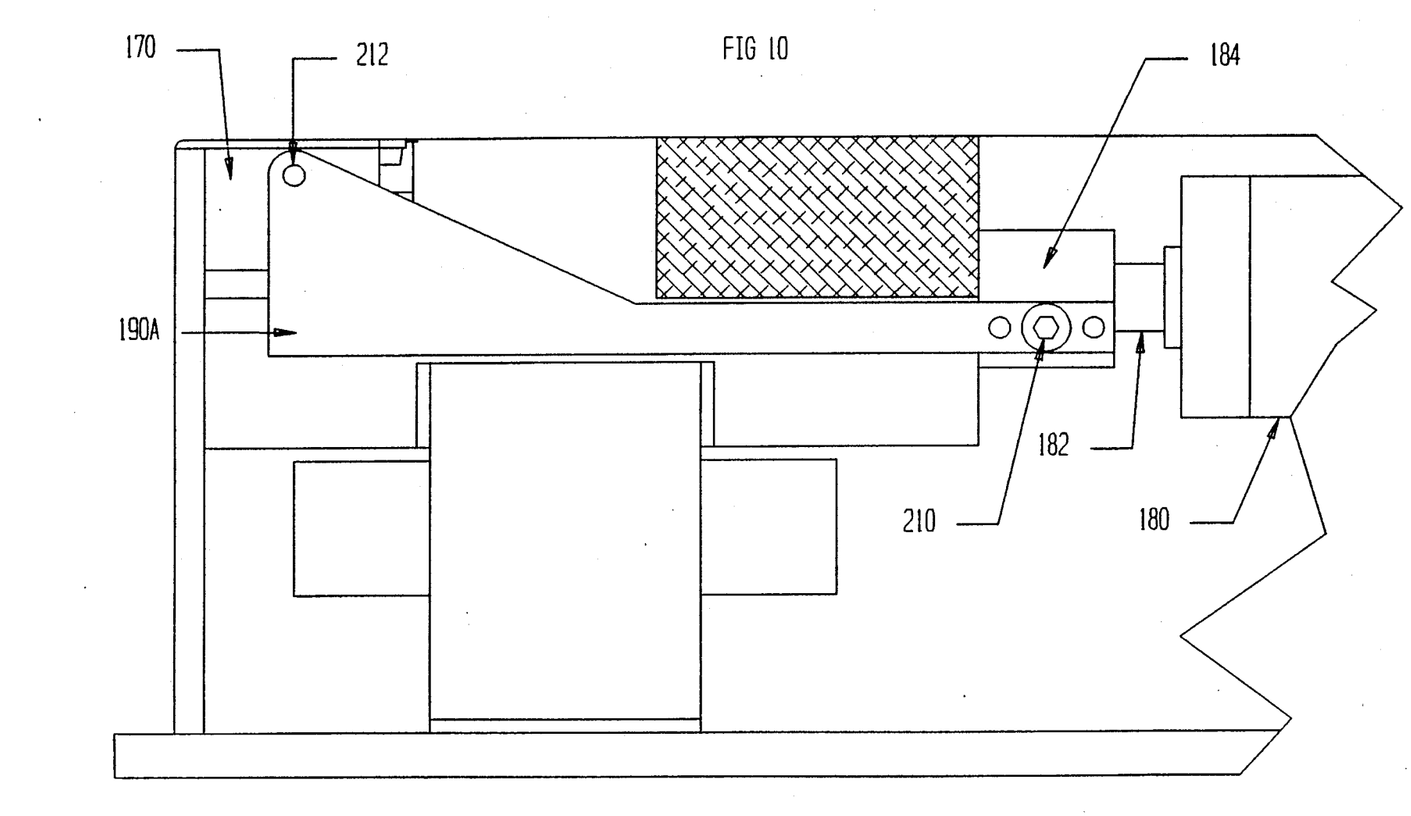
FIG. 10 is a partial side view of the apparatus of FIG. 1 with the side cover removed.

FIG. 10 shows a partial side view of the machine 100 with the side plate 112E removed. The link 190A connecting the tie bar 184 to the cut carriage 170 is connected to the tie bar 184 by fastener 210 and to the carriage 170 by pivot 212. A second link 190B (not visible in FIG. 10) connects the respective sides of the bar 184 and the carriage 170.

Figure 11:
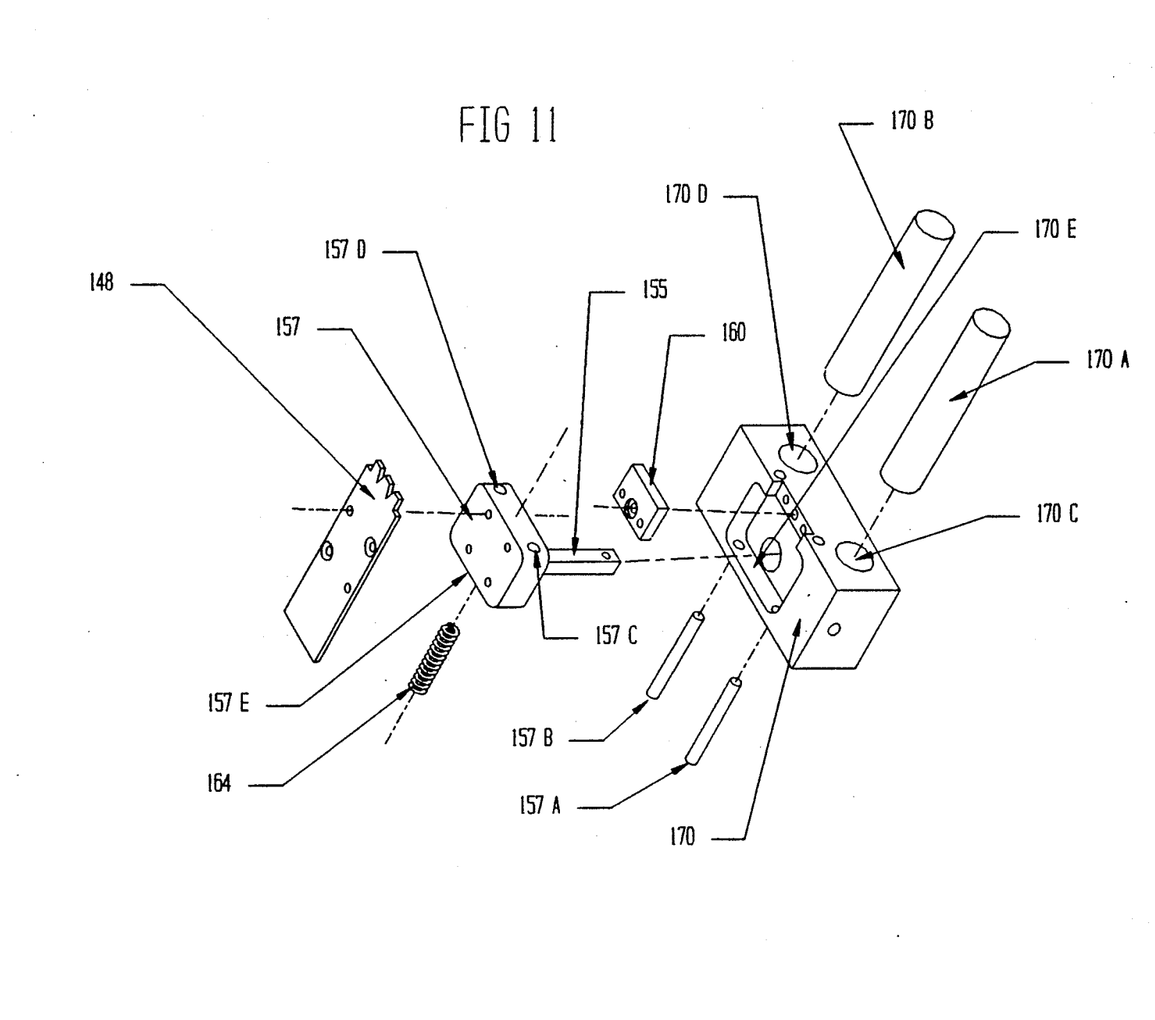
FIG. 11 is an exploded view illustrating the clamp-comb carriage and the cut carriage of the apparatus of FIG. 1.
Figure 12:
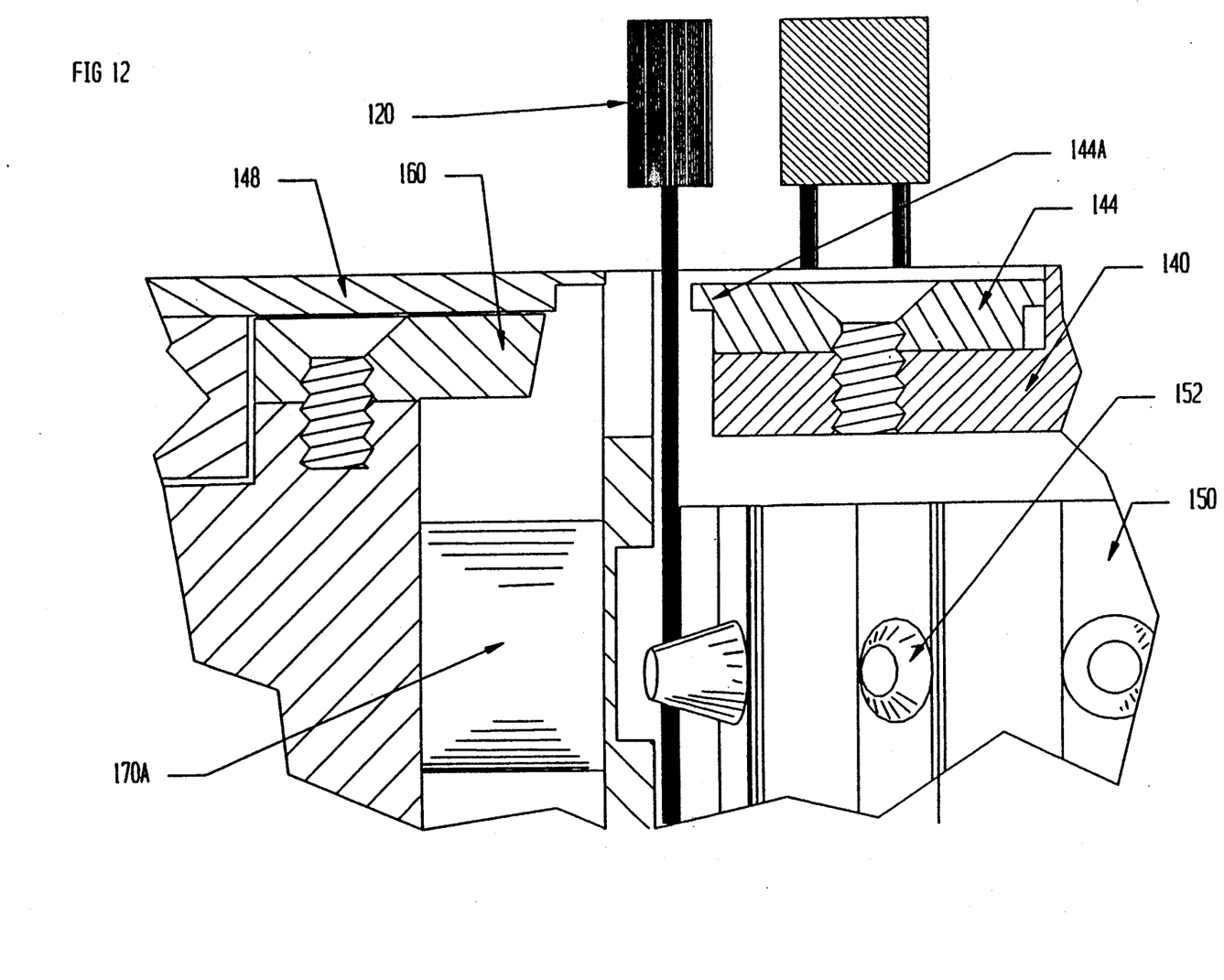
FIG. 12 is an enlarged cross-sectional view of the clamping and cutting station, illustrative of the interrelationship of the cutting and clamping dies.

FIG. 11 shows an exploded diagrammatic illustration of elements of the comb-clamp carriage 157 and the cut carriage 170. The cut carriage 170 is mounted for sliding movement on the two parallel ways 170A and 170B, which fit into corresponding bores 170C and 170D formed in the carriage 170. The links 190A and 190B connect to the carriage 170, and provide drive forces to slide the carriage 170 along the ways 170A and 170B to cut the lead in one direction and to withdraw the comb-clamp carriage 157 and the cut carriage 170 in the other direction. The clamp-comb carriage 157 is mounted for sliding movement on parallel ways 157A and 157B carried by the cut carriage 170. The ways 157A and 157B are fitted into corresponding bores 157C and 157D formed in the carriage 157. The position of the carriage 157 is biased by clamp spring 164, which is compressed between surface 157E of carriage 157 and 170E of carriage 170. The spring is further compressed as the carriage 170 is moved to cut the leads, since the comb-clamp element 148 is stopped against the lip 144A of the fixed cutter elements 144. The comb-clamp carriage 157 to slide in relation to carriage 170 when the element 148 contacts the lip 144A, so that the comb-clamp die 148 exerts only a clamping, and not a cutting, force on the component leads. The spring bias provides the lead clamping force.

The cylinder 180 and the pneumatic index 156 are actuated by pneumatic valves (not shown) in the conventional manner.

A radial lead component feeder has been described, and has the following important advantages:

1. The machine has a narrow footprint resulting from the in-line configuration of the indexer wheel and lead clamping and cutting station elements.

2. The mechanical components of the machine are relatively simple, thereby providing reliable machine operation and relatively lower cost manufacture.

3. The machine can be quickly adjusted to cut the component leads to particular desired lengths without disassembly of the machine.

4. The machine can be readily adjusted to different tape configurations by removing and reorienting the tape index wheel.

It is understood that the above-described embodiment is merely illustrative of the possible specific embodiments which may represent principles of the present invention. Other arrangements may readily be devised in accordance with these principles by those skilled in the art without departing from the scope of the invention.

What is claimed is:

1. A radial lead component feeder apparatus for clamping and cutting to a predetermined length the leads of electrical components secured to tape, the feeder characterized by a longitudinal center line, the electrical components being characterized by a component body and in that component lead or leads emerge from generally the same side or portion of the component body, the apparatus comprising:

a rotary tape drive means for driving the tape on which the electrical components are secured to sequentially position components at a lead clamping and cutting station, said drive means comprising a drive wheel having means for engaging the tape about the wheel periphery and mounted for rotation about a wheel axis which extends in a direction substantially perpendicular to said center line;

a lead clamping and cutting station fixed in position at the periphery of said wheel along said center line, said station comprising means for clamping at least one lead of the component positioned at the station and means for cutting to a predetermined length the component leads, wherein said component is held in place at said station after said lead has been cut in readiness for removal; and means for guiding the tape to which the components are secured to the rotary tape drive means and means for guiding the spent tape away from the drive means after the leads of respective successive components have been clamped and cut to said predetermined length.

2. The apparatus of claim 1 wherein said tape is characterized by a plurality of spaced sprocket holes, and wherein said drive wheel further comprises a plurality of radially extending sprocket pins spaced to engage in said tape sprocket holes.

3. The apparatus of claim 2 further comprising means for adjusting said drive wheel to a plurality of tape sprocket hole phasings.

4. A component lead cutting apparatus for radial lead electrical components secured to tape, the electrical components being characterized by a component body and in that component lead or leads emerge from generally the same side or portion of the component body, the apparatus comprising:

tape reel support for supporting an electrical component tape reel, comprising an elongated structure extending along a longitudinal feeder axis;

tape drive means, comprising a drive wheel mounted on an axis along the feeder axis and extending substantially perpendicular to said axis, the wheel comprising means for engaging the tape and advancing the tape to sequentially align components secured in the tape at a lead cutting station fixed in position along said feeder axis and adjacent the periphery of said wheel;

clamping means located at said station for clamping a selected component lead of an electrical component positioned at said station; and cutting means cooperating with said clamping means for cutting said lead of the electrical component positioned at said station.

5. The apparatus of claim 4 wherein said tape is characterized by a plurality of spaced sprocket holes, and wherein said drive wheel further comprises a plurality of radially extending sprocket pins spaced to engage in said tape sprocket holes.

6. The apparatus of claim 5 further comprising means for adjusting said drive wheel to a plurality of tape sprocket hole phasings.

7. The apparatus of claim 4 further comprising means for guiding the spent tape away from said lead cutting station, said means comprising means for defining an elongated tape guide slot for guiding the spent tape toward one end of said apparatus.

8. The apparatus of claim 4 wherein said cutting means comprises:

a fixed cutter blade disposed at the lead cutting station;

a moving cutter blade mounted on a cut carriage;

said cut carriage arranged for sliding movement on support ways extending substantially parallel to said longitudinal feeder axis;

drive means for driving the cut carriage to move the moving cutter blade in juxtaposition with said fixed blade to cut said lead.

9. A component feeder apparatus for clamping and cutting to a predetermined length the leads of electrical components secured to tape characterized by a plurality of spaced sprocket holes, comprising:

a rotary tape drive means for driving the tape on which the electrical components are secured to sequentially position components at a lead clamping and cutting station, said drive means comprising a drive shaft and a drive wheel fitted thereon, said drive wheel having a plurality of radially extending sprocket pins spaced to engage in said tape sprocket holes and mounted for rotation about a wheel axis;

a lead clamping and cutting station comprising means for clamping at least one lead of the component positioned at the station and means for cutting to a predetermined length the component leads, said station being disposed at the periphery of said wheel;

means for guiding the tape to which the components are secured to the rotary tape drive means and means for guiding the spent tape away from the drive means after the leads of respective successive components have been clamped and cut to said predetermined length; and means for selectively locking the wheel to a plurality of positions rotated about the shaft by a selected angular spacing to accommodate different tape sprocket hole phasings.

10. The apparatus of claim 9 wherein said selective locking means comprises a plurality of key slots formed in said wheel and a key fitted in a key slot on said shaft.

11. A component feeder apparatus for clamping and cutting to a predetermined length the leads of electrical components secured to tape, comprising:

a rotary tape drive means for driving the tape on which the electrical components are secured to sequentially position components at a lead clamping and cutting station, said drive means comprising a drive wheel having means for engaging the tape about the wheel periphery and mounted for rotation about a wheel axis;

a lead clamping and cutting station comprising means for clamping at least one lead of the component positioned at the station and means for cutting to a predetermined length the component leads, said station being disposed at the periphery of said wheel;

means for guiding the tape to which the components are secured to the rotary tape drive means and means for guiding the spent tape away from the drive means after the leads of respective successive components have been clamped and cut to said predetermined length; and means for adjusting the axial position of said tape engaging means of said wheel in relation to said lead cutting means so as to adjust the apparatus to cut the component leads to a desired length.

12. The apparatus of claim 11 wherein said apparatus extends along a feeder apparatus axis, and said station and said rotary drive means are disposed along said feeder apparatus axis, said wheel axis being disposed substantially perpendicular to said feeder axis, said drive means further comprising a drive shaft which is secured in a shaft bore formed in said wheel through a first surface thereof, and wherein said adjusting means comprises means for selectively securing said wheel to said shaft at different positions along at least a portion of the axial extent of said shaft.

13. The apparatus of claim 12 wherein said adjusting means further comprises a hub lock arrangement comprising a hub lock element and means adjacent said station for selectively engaging said hub lock element to secure the wheel to the shaft.

14. The apparatus of claim 13 wherein said hub lock arrangement is further characterized by a cutout region defined in said wheel and extending through said first surface into said wheel adjacent said shaft bore, said hub lock element arranged to fit into said cutout region and a threaded bore defined at the interface between the hub lock element and the wheel, said bore terminated in a taper, said arrangement further comprising a threaded member received in said threaded bore and tending to force said hub lock element against the shaft as the threaded element engages the tapered portion of the bore.

15. A component lead cutting apparatus for radial lead electrical components secured to tape, comprising:

tape reel support means for supporting an electrical component tape reel, comprising an elongated structure extending along a longitudinal feeder axis;

tape drive means comprising a drive wheel mounted on an axis along the feeder axis and extending substantially perpendicular to said axis, said wheel comprising means for engaging the tape and advancing the tape to sequentially align components secured in the tape at a lead cutting station, said station disposed along said feeder axis and adjacent the periphery of said wheel;

clamping means located at said station for clamping a selected component lead of an electrical component positioned at said station;

cutting means cooperating with said clamping means for cutting said lead of the electrical component positioned at said station; and means for adjusting the position of said tape engaging means in relation to said lead cutting station, so as to adjust the apparatus to cut the leads to a desired length.

16. The apparatus of claim 15 wherein said tape drive means further comprises a drive shaft which is secured in a shaft bore formed in said wheel through a first surface thereof, and wherein said adjusting means comprises means for selectively securing said wheel to said shaft at different positions along at least a portion of the axial extent of said shaft.

17. The apparatus of claim 16 wherein said adjusting means further comprises a hub lock arrangement comprising a hub lock element and means adjacent said station for selectively engaging said hub lock element to secure the wheel to the shaft.

18. The apparatus of claim 17 wherein said hub lock arrangement is further characterized by a cutout region defined in said wheel and extending through said first surface into the wheel adjacent said shaft bore, said hub lock element arranged to fit into said cutout region and a threaded bore defined at the interface between the hub lock element and the wheel by the hub lock element structure and the wheel structure, said bore terminated in a taper, said bore extending through a second wheel surface and offset from but substantially aligned with the wheel axis, said arrangement further comprising a threaded member received in said threaded bore and tending to force said hub lock element against the shaft as the threaded element engages the tapered portion of the bore.

19. A component lead cutting apparatus for radial lead electrical components secured to tape characterized by a plurality of spaced sprocket holes, comprising:

tape reel support means for supporting an electrical component tape reel comprising an elongated structure extending along a longitudinal feeder axis;

tape drive means, comprising a drive wheel mounted on an axis along the feeder axis and extending substantially perpendicular to said axis, said wheel comprising means for engaging the tape and advancing the tape to sequentially align components secured in the tape at a lead cutting station, said engaging means comprising a plurality of radially extending sprocket pins spaced to engage in said tape sprocket holes, said station disposed along said feeder axis and adjacent the periphery of said wheel;

clamping means located at said station for clamping a selected component lead of an electrical component positioned at said station;

cutting means cooperating with the clamping means for cutting said lead of the electrical component positioned at said station; and means for selectively locking the wheel to a plurality of positions rotated about the shaft by a selected angular spacing to accommodate different tape sprocket hole phasings.

20. The apparatus of claim 19 wherein said selective locking means comprises a plurality of key slots formed in said wheel and a key fitted in a key slot on said shaft.

21. A component lead cutting apparatus for radial lead electrical components secured to tape, comprising:

tape reel support for supporting an electrical component tape reel, comprising an elongated structure extending along a longitudinal feeder axis;

tape drive means comprising a drive wheel mounted on an axis along the feeder axis and extending substantially perpendicular to said axis, the wheel comprising means for engaging the tape and advancing the tape to sequentially align components secured in the tape at a lead cutting station, said station disposed along said feeder axis and adjacent the periphery of said wheel;

clamping means located at said station for clamping a selected component lead of an electrical component positioned at said station; and cutting means cooperating with the clamping means for cutting said lead of the electrical component positioned at said station, said cutting means comprising:

a fixed cutter blade disposed at the lead cutting station and secured over said wheel;

a moving cutter blade mounted on a cut carriage;

said cut carriage arranged for sliding movement on support ways extending substantially parallel to said longitudinal feeder axis; and drive means for driving the cut carriage to move the moving cutter blade in juxtaposition with said fixed blade to cut said lead.

22. The apparatus of claim 21 wherein said clamping means comprises a clamp carriage carried by said cut carriage, a clamp element being secured to said clamp carriage and arranged to clamp the component lead against said fixed cutter blade as the moving cutter blade is moved into juxtaposition with said fixed blade to cut said lead.

* * * * *